(12) United States Patent
Urienza (10) Patent No.: US 8,368,167 B1
(45) Date of Patent: Feb. 5, 2013

(54) SCHOTTKY DIODE WITH EXTENDED FORWARD CURRENT CAPABILITY

(75) Inventor: Joseph Urienza, Milpitas, CA (US)

(73) Assignee: Chengdu Monolithic Power Systems, Inc., Chengdu (CN)

(*) Notice: Subject to any disclaimer, the term of this patent is extended or adjusted under 35 U.S.C. 154(b) by 0 days.

(21) Appl. No.: 13/251,069

(22) Filed: Sep. 30, 2011

(51) Int. Cl.
*H01L 29/66* (2006.01)
*H01L 29/47* (2006.01)
*H01L 21/28* (2006.01)

(52) U.S. Cl. .................. 257/484; 257/471; 438/570

(58) Field of Classification Search .................. None
See application file for complete search history.

(56) References Cited

U.S. PATENT DOCUMENTS

| | | | | |
|---|---|---|---|---|
| 5,539,237 | A * | 7/1996 | Todd et al. | 257/484 |
| 5,696,025 | A * | 12/1997 | Violette et al. | 438/570 |
| 7,229,866 | B2 * | 6/2007 | Zhu et al. | 438/167 |
| 2005/0202661 | A1 * | 9/2005 | Ceruzzi et al. | 438/570 |
| 2009/0283841 | A1 * | 11/2009 | Yeh et al. | 257/384 |
| 2012/0056294 | A1 * | 3/2012 | Yoo | 257/484 |

OTHER PUBLICATIONS

D.J. Spry et al., High Breakdown Field P-type 3C-SiC Schottky Diode Grown on Step-Free 4H-SiC Mesas, 2004, Materials Science Forums vols. 457-460 pp. 1061-1064.*
M.P. Lepselter et al., Silicon Schottky Barrier Diode with Near-Ideal I-V Characteristics, Oct. 19, 1967.*
U.S. Appl. No. 13/051,437, filed Mar. 18, 2011.

* cited by examiner

*Primary Examiner* — Julio J Maldonado
*Assistant Examiner* — Harpreet Singh
(74) *Attorney, Agent, or Firm* — Perkins Coie LLP (57) ABSTRACT

The embodiments of the present invention disclose a semiconductor device and a method for forming the semiconductor device. Wherein the semiconductor comprises: a first semiconductor layer, having a first conductivity type on a semiconductor substrate, a guard ring region, formed in the surface of the first semiconductor layer, having a second conductivity type; a Schottky diode metal contact, coupled to the first semiconductor layer, wherein the guard ring region is at periphery of the Schottky diode interface, and wherein the Schottky diode metal contact has no direct electrical connection with the guard ring region; and an electrical resistance module, coupled between the Schottky diode metal contact and the guard ring. Due to the ballasting effect from the electrical resistance module, the minority injection or the parasitic transistor action are alleviated. Thus, forward current capability is extended without introducing significant minority injection.

20 Claims, 9 Drawing Sheets

SCHOTTKY DIODE WITH EXTENDED FORWARD CURRENT CAPABILITY

TECHNICAL FIELD

The present invention generally relates to semiconductor device, and more particularly but not exclusively relates to Schottky diode.

BACKGROUND

In integrated circuit technology, the Schottky diode has many important advantages over the regular diode such as low forward voltage drop, being majority carrier device, fast switching and so on. Meanwhile, it is required to enhance or to improve some performances of the Schottky diode, for example, a higher forward current, a lower leakage current, a higher breakdown voltage, etc.

Figure 1:
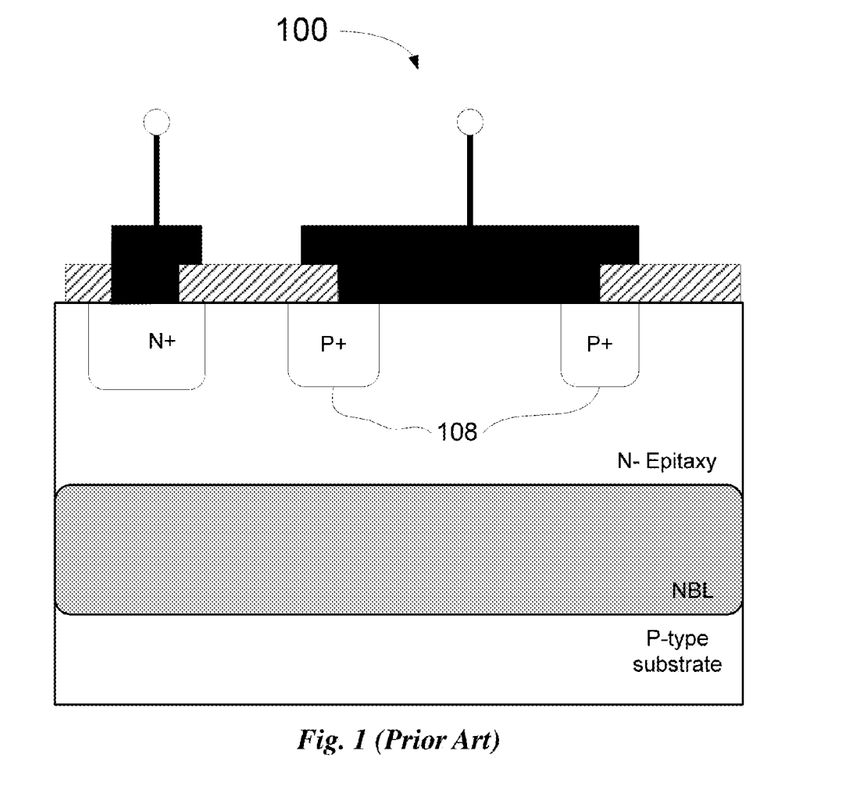
FIG. 1 illustrates a prior art cross-section structure of a typical Schottky diode.

Sometimes improving one parameter needs to compromise another parameter. For an instance, a low leakage Schottky diode comes with a limited forward current capability. FIG. 1 schematically depicts a cross-section structure of a typical Schottky diode 100. Conventionally, a P-type guard ring structure 108 is comprised in diode 100 configured to improve at least the performances of breakdown voltage and leakage current. However, P-type guard ring 108 also brings some parasitic effects. For example, when a large forward current flows through Schottky diode 100, a serious minority injection and a PNP transistor action may occur, and this may lead to either undesirable parametric deficiency or destructive failure. Hence the forward current ability of low leakage Schottky diode is limited.

BRIEF SUMMARY

One embodiment of the present invention discloses a semiconductor device. The semiconductor device comprises a first semiconductor layer, having a first conductivity type, wherein the first semiconductor layer is formed on a semiconductor substrate; a cathode contact region, formed in the first semiconductor layer, wherein the cathode contact region has a first conductivity type with a heavy doping concentration; a guard ring, formed in the first semiconductor layer, wherein the guard ring comprises a guard ring interface to the first semiconductor layer, wherein the guard ring has a second conductivity type, and wherein the guard ring is coupled to a guard ring contact; a Schottky diode metal contact, coupled to the first semiconductor layer, the Schottky diode metal contact comprising a Schottky diode interface to the first semiconductor layer, wherein the guard ring region is at periphery of the Schottky diode interface, and wherein the Schottky diode metal contact separates apart from the guard ring region; and an electrical resistance module, coupled between the Schottky diode metal contact and the guard ring.

BRIEF DESCRIPTION OF THE DRAWINGS

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Many details are described below with reference to semiconductor substrate. The term "semiconductor substrate" hereby is used throughout to comprise a various of articles of manufacture, comprising, for example, individual integrate circuit dies, sensor dies, discrete device dies, and/or dies having other semiconductor features. One of ordinary skill in relative art should also understand that the certain conductivity types of the semiconductor materials described in the following text are for the interpretation of certain embodiments. However, alternative conductivity types of the semiconductor materials may also apply according to other embodiments of the present invention.

Figure 2A:
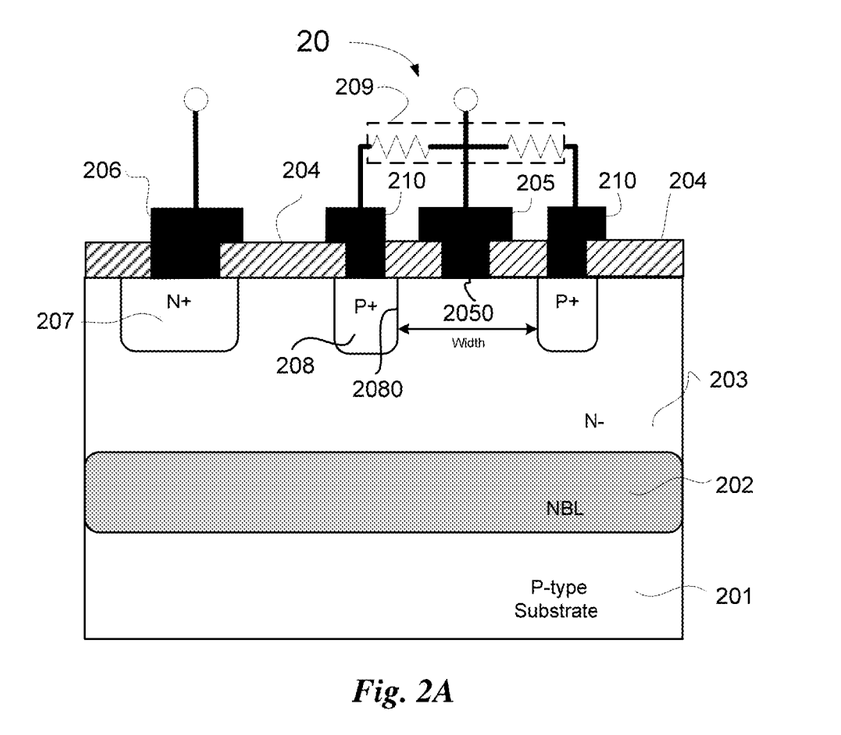
FIG. 2A schematically illustrates a cross-section view of a low leakage Schottky diode in accordance with some embodiments of the present invention.

FIG. 2A schematically illustrates a cross-section view of a low leakage Schottky diode 20 in accordance with some embodiments of the present invention. Seen in FIG. 2A, low leakage Schottky diode 20 is formed on a P-type semiconductor substrate 201. An N-type buried layer (NBL) 202 is formed on P-type substrate 201 and an N-type epitaxy layer is further formed on NBL 202 as an N-well 203. NBL 202 is utilized to decrease parasitic body series-resistance and may be omitted according to other embodiments of the present invention. N-well 203 is conventionally lightly doped (e.g. ~$10^{16}$ cm$^{-3}$). By forming a Schottky diode metal contact 205 on N-well 203, a Schottky diode is formed thereon. This Schottky diode metal contact 205 serves as anode electrode, and the interface between Schottky diode metal contact 205 and N-well 203 is defined as Schottky diode interface 2050. Another metal electrode as cathode electrode 206 is coupled to an N+ type cathode contact region 207. Cathode contact region 207 is usually heavily doped (e.g. $10^{19}$-$10^{20}$ cm$^{-3}$) and is configured to form an ohmic contact with cathode electrode 206. A P-type guard ring 208 surrounds the edge of Schottky diode interface 2050, configured to at least alleviate the electric field at the edge of the Schottky diode interface 2050. P-type guard ring 208 has an interface 2080 to part of N-well 203 which is near the edge of the Schottky diode interface 2050. Another metal electrode as guard ring electrode 210 is coupled with P-type guard ring 208 configured to form another ohmic contact. A layer of dielectric insulation 204 isolates Schottky diode metal contact 205, cathode electrode 206 and guard ring electrode 210 from each other. In the scope of the present invention, the metal electrodes may comprise Ptsi, TiSi2, NiSi, Pt, Ti, Al, Ni or any other suitable materials. The dielectric insulation layer may be comprised of $SiO_2$, $Si_3N_4$ or any other suitable materials. One feature of the present embodiment is that the Schottky diode metal contact 205 is put into a Schottky window formed by the P-type guard ring 208 so that the Schottky diode interface 2050 is separated apart from P-type guard ring 208 to isolate the two parts. The size of the Schottky window should be limited in a certain scale in order to maintain the function of P-type guard ring 208 to minimize the electric field. In one embodiment, the minimum width of the Schottky window is about 1.4 um. However, in other embodiment, the separation distance may be other value which is process dependent and design rule limited. An additional electrical resistance module 209 is coupled between Schottky diode interface 2050 and the interface of the guard ring region 2080. In the illustrated embodiment, electrical resistance module 209 is connected between Schottky diode metal contact 205 and guard ring electrode 210, and resistive module 209 comprises a couple of parallel resistors. However, in other embodiments, resistive module 209 may comprise a random number of resistors in parallel or in series, or be placed at other suitable position. The term "resistor" hereby comprises a various types of element that implements an electrical resistance, such as integrated resistor structure, discrete resistor structure, parasitic resistor structure and so on.

Figure 2B:
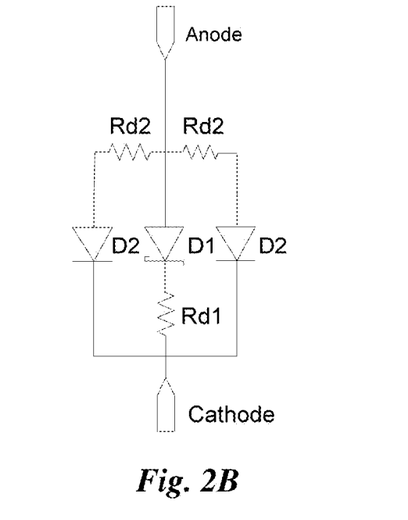
FIG. 2B illustrates an equivalent schematic circuit of the structure shown in FIG. 2A according to an embodiment of the present invention.

FIG. 2B depicts an equivalent schematic circuit of the structure shown in FIG. 2A according to an embodiment of the present invention. Seen in FIG. 2B, diode D1 represents the Schottky diode formed at Schottky diode interface 2050. The P-type guard ring interface 2080 between P-type guard ring 208 and N-well 203 generates parasitic P-N junction diodes D2 (all parallel diodes become D2). Resistor Rd1 is defined as the path resistance from the edge of P-type guard ring interface 2080 to the edge of Schottky diode interface 2050 of Schottky diode D1. Resistors Rd2 which refer to the resistive module 209 are parallel coupled between the anode of Schottky diode D1 and the anodes of P-N junction diodes D2. One feature of various embodiments is that the impedance of Rd2 tracks with Rd1. In one embodiment, the impedances of Rd1 and Rd2 substantially have the same order of magnitude, that is to say, the ratio between the impedance of the electrical resistance module Rd2 and the path impedance from the edge of the guard ring interface to the Schottky diode interface Rd1 is from $\frac{1}{10}$ to 10. In one embodiment, the impedance of Rd2 equals Rd1. In another embodiment, the impedance of Rd2 is as twice large as Rd1. In yet other embodiments, the impedance of Rd2 may have diverse value depending on certain conditions or may follow the variation of Rd1 when the environment parameters are changed.

When the Schottky diode D1 is operating, the resistors Rd2 serve as ballast resistors for the parasitic P-N junction diode D2. As the current flowing through the Schottky diode D1 increases, voltage drops across the equivalent resistor Rd1 becomes larger too. Once the forward voltage drops between the Schottky diode D1 (with Rd1) diode and the parasitic P-N junction diode D2 (with Rd2) become comparable, the PN junction diode D2 starts to inject minority carrier into the cathode N-well 203. However, due to the ballasting effect from the resistor Rd2, the voltage drop across the PN junction diode D2 is reduced by the resistor Rd2, the minority injection and the PNP parasitic action are at least alleviated. Thus increasing further the Schottky diode forward current does not anymore generate substantial minority injection. In certain occasion, even if there is a small amount of injection, an additional minority collector (not shown in FIG. 2A) may further weaken the effect. As a result, undesirable PNP action or latch up occurrence is much reduced. The low leakage Schottky diode may bear a relative larger forward current without compromising other parameters.

Figure 3A:
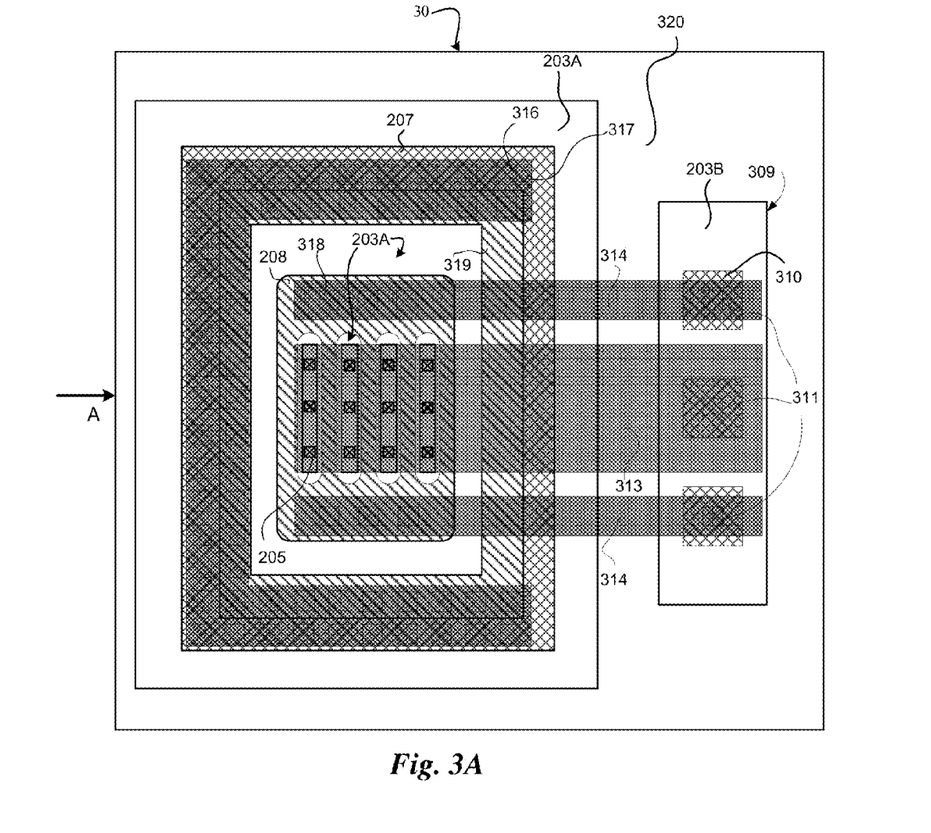
FIG. 3A illustrates a specific layout scheme of a low leakage Schottky diode according to an embodiment of the present invention.
Figure 3B:
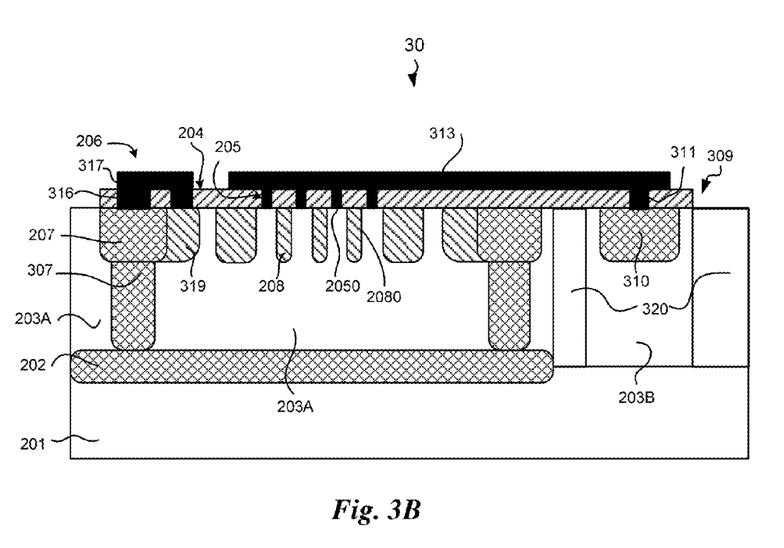
FIG. 3B illustrates a cross-section view of the low leakage Schottky diode shown in FIG. 3A taken along axis A according to an embodiment of the present invention.

FIG. 3A illustrates a specific layout scheme of a low leakage Schottky diode 30 according to an embodiment of the present invention. As seen in FIG. 3B, Schottky diode 30 is formed on a single die. Schottky diode metal contacts 205 are grown on a first N-well 203A to form a Schottky diode. P-type guard ring 208 forms the Schottky window and is isolated from Schottky diode metal contacts 205. N+ cathode region 207 is square frame shaped and surrounds P-type guard ring 208. In certain embodiments, an optional P-type minority collector 319 may be placed between P-type guard ring 208 and N+ cathode region 207 to further weaken the minority injection. P-type minority collector 319 abuts N+ cathode region 207 configured to deter minority injection effect by collecting minority carriers and the overall number of wandering minority carrier is minimized. In one embodiment, P-type minority collector 319 may have the same doping concentration with P-type guard ring 208. In other embodiment, minority collector 319 may be dropped. The semi-transparent parts comprise a cathode metal layer 317 overlapping three sides of N+ cathode region 207 from the top plane view of the embodiment shown in FIG. 3B. In other embodiments, the cathode metal layer 317 can have other shapes. Cathode metal layer 317 is also connected to minority collector 319. Therefore Cathode region 207 is shorted to minority collector 319. Cathode contacts 316 are arranged along with the cathode metal layer 317. As seen in FIG. 3B, an integrated resistor 309 corresponding to electrical resistance module 209 comprises three resistor contacts 311. Each of resistor contact 311 is connected to an N+ contact region 310 configured to form ohmic contact. N+ contact regions 310 are formed in a second N-well 203B. The resistance of integrated resistor 309 depends on the separation distance of adjacent two N+ contact regions 310 and the resistivity of second N-well 203B. In the illustrated embodiment, integrated resistor 309 is an N-type Well resistor formed on second N-well region 203B and a P-Well region 320 encloses the second N-well region 203B. The semi-transparent parts further comprise a first metal wire 313 and two second metal wires 314.

One end of metal wire 313 is connected to Schottky diode metal contact 205. The other end of metal wire 313 is connected to one of resistor contacts 311 which is placed in the middle place. Therefore first metal wire 313 sets an interconnection between integrated resistor 309 and Schottky diode metal contact 205. While one end of second metal wires 314 are respectively connected to guard ring contacts 318 and the other end of second metal wires 314 is connected to the other two resistor contacts 311. Thus second metal wires 314 sets an interconnection between resistor 309 and P-type guard ring 308. Therefore, integrated resistor 309 which comprises two parallel integrated resistors each coupled between two adjacent resistor contacts 311 is electrically coupled between the Schottky diode metal contact 205 and P-type guard ring 208. The resistor contact 311 placed in the middle further serves as anode electrode of low leakage Schottky diode 30. One with ordinary skill in relevant art should understand that in other embodiment, integrated resistor 309 may further comprises different types of integrated resistor other than diffusion resistor such as polysilicon resistor, ion-implanted resistor, thin-film resistor, epitaxy resistor and so on, or have alternative conductivity type. The number and position of resistor contacts 311 may vary in other embodiments with one or some electrically coupled to the Schottky diode metal contacts and the others coupled to the P-type guard ring. Moreover, although all contacts in the illustrated embodiment—resistor contacts 311, Schottky diode metal contacts 205, cathode contacts 316 and guard ring contacts 318, are square, in other embodiments, the contacts may have other forms, for example, a long stripe contact.

FIG. 3B schematically illustrates a specific cross-section view of low leakage Schottky diode 30 taken along axis A according to the embodiment shown in FIG. 3A. As seen in FIG. 3B, semiconductor substrate 201, NBL 202, N-well 203, and cathode contact region 207 are the same as them shown in FIG. 2A in one embodiment. Dielectric insulation layer 204 separates each contact. Schottky diode interface 2050 is at the interface from Schottky diode metal contacts 205 to N-well 203 and is surrounded by P-type guard ring 208. In the illustrated embodiment, an optional deep N+ region 307 is coupled to N+ cathode contact 207 and stretched into the N-well. The other end of deep N+ region 307 is coupled with NBL layer 202. One functional feature of deep N+ region 307 is to lower the cathode series resistance just like the NBL. Cathode contacts 316 are coupled to N+ contact region 207 and optional minority collector 319 to form an ohmic contact. Cathode metal layer 317 is formed on cathode contacts 316. Cathode contacts 316 and cathode metal layer 317 together comprise cathode electrode 206.

Continuing with FIG. 3B, integrated resistor 309 comprises a second N-well region 203B, an N+ diffuse region 310 and resistor contact 311. In the embodiment disclosed here, the integrated resistor is an N-type Well resistor. P-well 320, together with P-substrate 201, encloses the integrated N-Well resistor 309. Thus, the integrated N-Well resistor 309 is isolated from first N-well region 203A on which the Schottky contact 205 is formed. Resistor contact 311 forms a contact between N+ region 310 and one end of first metal wire 313. Another end of first metal wire 313 is connected to Schottky diode metal contact 205. Integrated resistor 309 is placed a distance away per design rule from the first N-well 203A. In other embodiment, depending on the layout design, there may be some integrated circuit elements placed between the N+ cathode contact region 207 and integrated resistor 309.

Figure 4A:
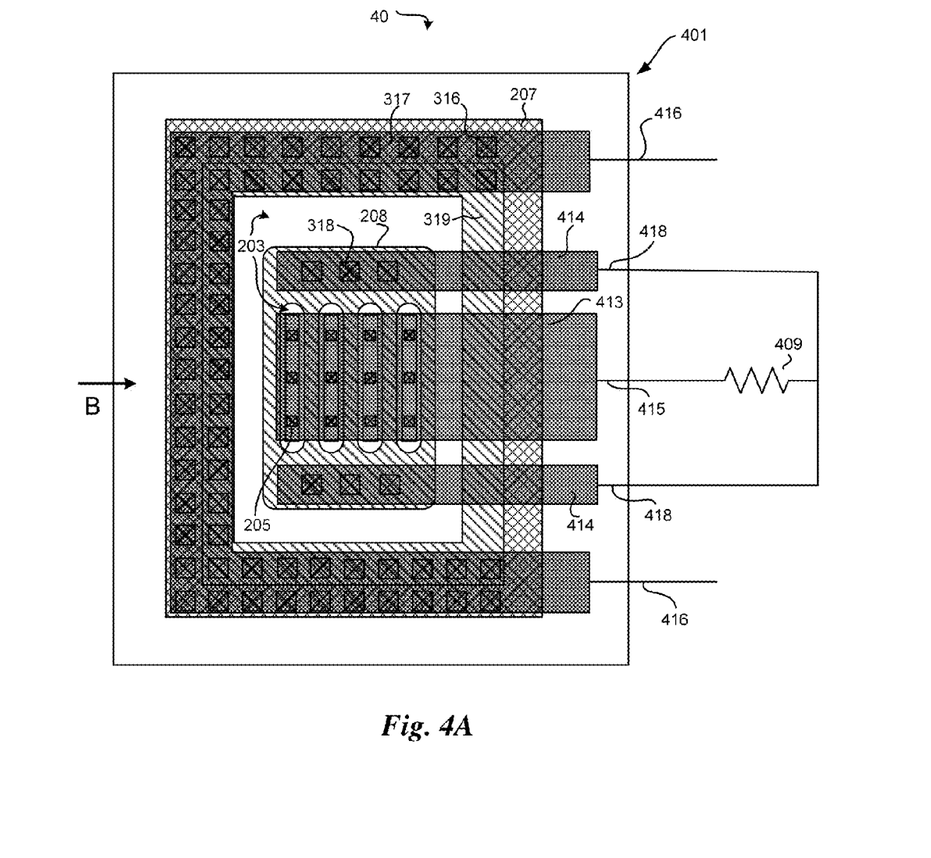
FIG. 4A illustrates a specific layout scheme of a Schottky diode according to another embodiment of the present invention.

FIG. 4A shows a specific layout scheme of a Schottky diode 40 according to another embodiment of the present invention. In the depicted embodiment, Schottky diode 40 comprises a Schottky diode die 401 and a discrete resistor 409. Discrete resistor 409 as the electrical resistance module 209 is positioned out of the Schottky diode die 401. Similar to the embodiment shown in FIG. 3A, Schottky diode die 401 comprises three types of metal wires including a first metal wire 413, a cathode metal layer 317 and a second metal wire 414. These metal wires stretch out of Schottky diode 401. An anode terminal 415 is coupled to Schottky diode metal contacts 205 through the first metal wire 413. A cathode terminal 416 is coupled to the cathode contacts 316 through the cathode metal layer 317. And a Guard ring terminal 418 is coupled to guard ring contacts 318 through the second metal wire 414. Discrete resistor 409 is connected between anode terminal 415 and guard ring terminal 418. Physically, terminals in this embodiment may comprise connection elements such as wire, metal layer, lead frame, pin and/or any other suitable elements. One with ordinary skill in relevant art should note that in the embodiment shown in FIGS. 4A and 4B, discrete resistor 409 is only a single discrete resistor. However, in other embodiment, discrete resistor 409 may comprises a rheostat, or a number of discrete resistors. And thereby the resistance value of discrete resistor 409 may be flexibly changed to meet different application occasions. The discrete resistor 409 may be fabricated on a semiconductor substrate, or may be fabricated with other materials such as metals.

Figure 4B:
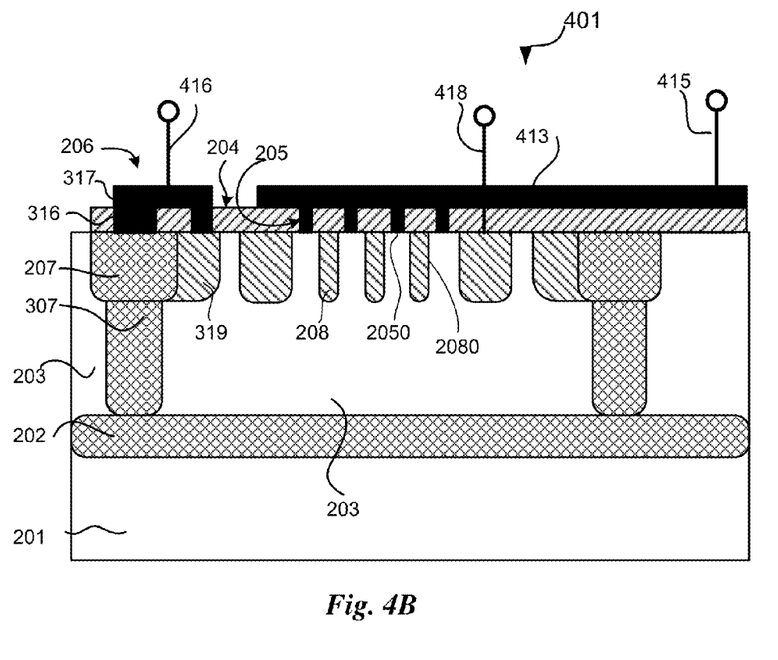
FIG. 4B illustrates a cross-section view of the Schottky diode die shown in FIG. 4A taken along axis B according to an embodiment of the present invention.

FIG. 4B depicts a specific cross-section view of Schottky diode die 40 taken along axis B. Similar to the embodiment shown in FIG. 3A, guard ring region 208 is separated apart from Schottky diode metal contact 205.

Figure 4C:
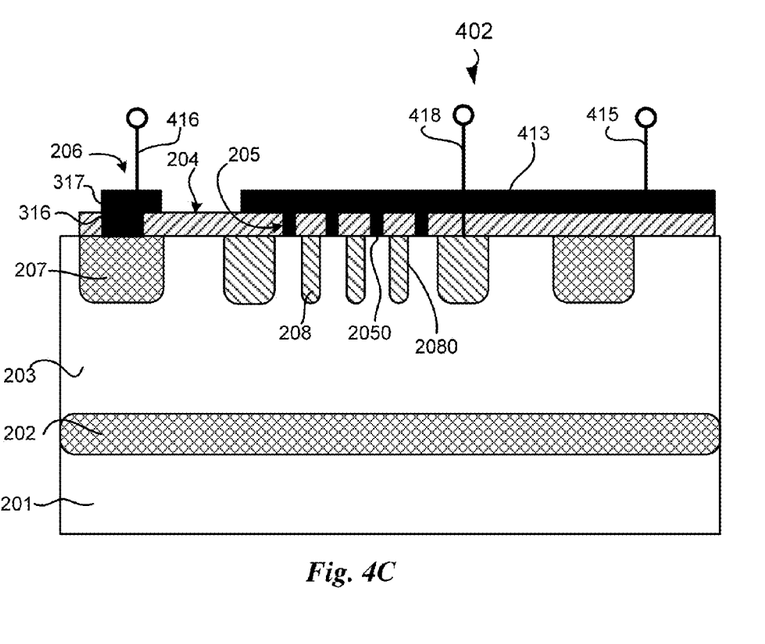
FIG. 4C illustrates a specific cross-section view of a Schottky diode die according to another embodiment of the present invention.

FIG. 4C illustrates a specific cross-section view of Schottky diode die 402 according to another embodiment of the present invention. Compared with Schottky diode die 401 shown in FIG. 4B, optional minority collector 319 and optional deep N+ region 307 are omitted.

Figure 5A:
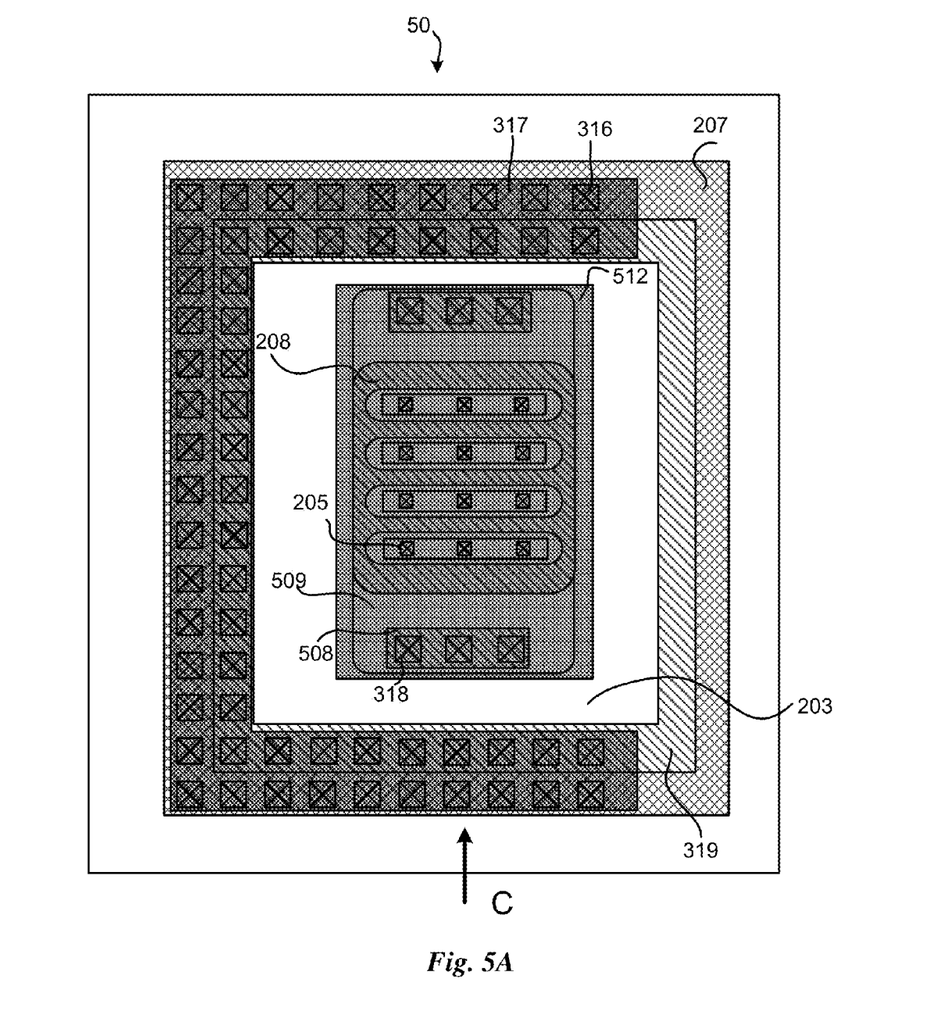
FIG. 5A illustrates a specific layout scheme of a low leakage Schottky diode according to yet another embodiment of the present invention.

FIG. 5A shows a specific layout scheme of a low leakage Schottky diode 50 according to yet another embodiment of the present invention. One feature of Schottky diode 50 is that it at least partly comprises a parasitic resistor structure as electrical resistance module 209. As seen in FIG. 5A, a P-well region 509 is in N-Well 203 and partly overlaps the outermost parts of P-type guard ring 208. P-well 509 is separated apart from the optional minority collector 319. A P+ guard ring ohmic contact region 508 is formed in P-well 509. In the illustrated embodiment, P+ guard ring ohmic contact region 508 is placed near the edge of P-well 509. Guard ring contact 318 is formed in P+ guard ring contact region 508 to obtain an ohmic contact. Thus a parasitic P-well resistor is formed as electrical resistance module 209. The semi-transparent region in the central is a metal layer 512. Metal layer 512 sets a connection between guard ring contact 318 and Schottky diode metal contact 205 and also serves as anode electrode of Schottky diode 50. As P-well region 509 is usually lightly doped (e.g. at relative doping concentration as N-well 203) and has high resistivity, it is utilized as a parasitic resistor coupled between the edge of P-type guard ring 208 and Schottky diode anode electrode without significantly affecting the function of P-type guard ring 308.

Figure 5B:
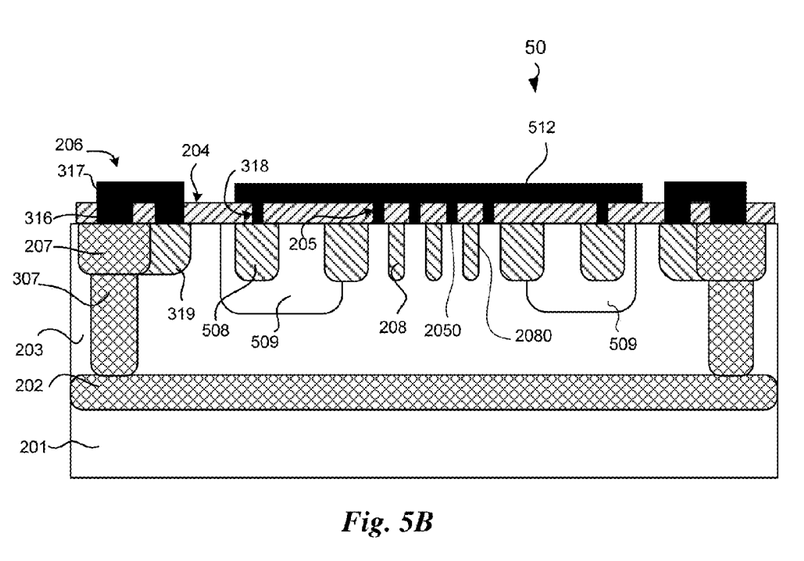
FIG. 5B schematically illustrates a specific cross-section view of the low leakage Schottky diode shown in FIG. 5A taken along axis C according to an embodiment of the present invention.

FIG. 5B schematically illustrates a specific cross-section view of low leakage Schottky diode 50 taken along axis C according to the embodiment shown in FIG. 5A. Referring to FIG. 5B, P-well region 509 contacts and encloses P+ ohmic contact region 508 and part of the outermost P-type guard ring 208. Guard ring contact 318 is connected to P+ ohmic contact region 508 and coupled to the Schottky metal contact 205 through metal layer 512. P-well 509 does not directly contact the interface of P-type guard ring 2080 or the middle part of P-type guard ring 208. In other embodiments, the depth and doping concentration of P-well 509 may be any other suitable value or the parasitic P-Well resistor may have a modulated resistivity. Although in this embodiment, the parasitic resistor structure is a parasitic P-well resistor, in other embodiment, other parasitic structure with electrical resistance may be utilized as electrical resistance module 209. One with ordinary skill in relevant art should also understand that other form of parasitic resistor may apply to at least partly be the electrical resistance module 209.

According to some embodiments of the present invention, a method for forming a Schottky diode is further disclosed with reference to the structures shown in FIGS. 2A-5B. The method comprises forming an N-type epitaxy layer on a P-type substrate; forming an N+ doped cathode contact region on the epitaxy layer; forming a guard ring region on the N-type epitaxy layer and coupling the guard ring region to a guard ring contact, wherein the guard ring region is a P-type region and has an interface to the N-type epitaxy layer; forming a Schottky diode metal contact coupled to the N-type epitaxy layer, wherein the guard ring region is at the periphery of the Schottky diode interface, and wherein the Schottky diode metal contact is separated apart from the guard ring region; and forming an electrical resistance module, wherein the electrical resistance module is coupled between the Schottky diode contact and P-type guard ring region.

In certain embodiments, the method may further comprise forming a minority collector region at the inner of the cathode region, wherein the collector region is also a P-type region coupled to the cathode region, and is separated from the guard ring region.

In some embodiments, forming an electrical resistance module may further comprise forming an integrated resistor. In one embodiment, forming the integrated resistor comprises forming an N-type resistor. Forming the N-type resistor comprises forming an N-type region over a P-Well region and forming three resistor contacts on the N-type region. A first metal wire is further formed to connect the middle resistor contact with the Schottky diode metal contact, and two second metal wires are formed to connect the other two contacts with the guard ring contact.

In some other embodiments, forming an electrical resistance module may comprise coupling a discrete resistor between the Schottky diode metal contact and the guard ring region. The discrete resistor has a first end and a second end, in this embodiment, the method further comprises connecting the first end of the discrete resistor to the Schottky diode metal contact and connecting the second end of the discrete resistor to the guard ring contact, wherein the connection may be formed by wires, metal wire, lead frame, pin and/or other suitable mediums In yet some other embodiments, forming an electrical resistance module may comprise forming a parasitic resistor. In one embodiment, forming the parasitic resistor comprises forming a lightly doped P-well region surrounding the outermost P-type guard ring, and forming an additional P+ ohmic contact region at outermost portion of the P-well, wherein the guard ring pickup contact is formed on this P+ ohmic contact region, and the P-well separates the P-type guard ring from the P+ ohmic contact region. The effective resistor module now becomes the P-Well resistance between P+ ohmic contact edge and the outermost P-type guard ring edge.

The above structures or parts are mentioned either in N type or P type. However, the doping type for the structures or parts in each embodiment can be the opposite.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

I claim:

1. A semiconductor device, comprising:
a first semiconductor layer, having a first conductivity type, wherein the first semiconductor layer is formed on a semiconductor substrate having a second conductivity type;
a cathode contact region, formed in the first semiconductor layer, wherein the cathode contact region has a first conductivity type with a heavy doping concentration;
a guard ring, formed in the first semiconductor layer and forming a Schottky window, wherein the guard ring comprises a guard ring interface to the first semiconductor layer, wherein the guard ring has a second conductivity type, and wherein the guard ring is coupled to a guard ring contact;
a Schottky diode metal contact, coupled to the first semiconductor layer, the Schottky diode metal contact comprising a Schottky diode interface to the first semiconductor layer, wherein the Schottky diode metal contact is placed at the Schottky window and wherein the Schottky diode interface separates apart from the guard ring region; and
an electrical resistance module, coupled between the Schottky diode metal contact and the guard ring.

2. The semiconductor device according to claim 1, further comprising a minority collector, formed at the periphery of the Schottky diode metal contact and separated from the guard ring, wherein the minority collector is coupled to the cathode contact region, and wherein the minority collector has the second conductivity type.

3. The semiconductor device according to claim 1, wherein the minimum width of the Schottky window is about 1.4 um.

4. The semiconductor device according to claim 1, wherein the ratio between the impedance of the electrical resistance module and the path impedance from the edge of the guard ring interface to the Schottky diode interface is from 1/10 to 10.

5. The semiconductor device according to claim 4, wherein the impedance of the electrical resistance module equals the path impedance from the edge of the guard ring interface to the Schottky diode interface.

6. The semiconductor device according to claim 4, wherein the impedance of the electrical resistance module equals twice of the path impedance from the edge of the guard ring interface to the Schottky diode interface.

7. The semiconductor device according to claim 1, wherein the electrical resistance module comprises an integrated resistor.

8. The semiconductor device according to claim 7, wherein the integrated resistor is a diffused resistor.

9. The semiconductor device according to claim 8, wherein the diffused resistor further comprises a diffused region and three resistor contacts in a row, wherein the middle resistor contact is connected to the Schottky diode metal contact through a first metal wire, and wherein the other two resistor contacts are connected to the guard ring contact through second metal wires.

10. The semiconductor device according to claim 1, wherein the electrical resistance module further comprises a discrete resistor, wherein the discrete resistor comprises a first end and a second end, wherein the first end is connected to the Schottky diode metal contact and the second end is connected to the guard ring contact.

11. The semiconductor device according to claim 1, wherein the electrical resistance module further comprises a parasitic resistor.

12. The semiconductor device according to claim 11, wherein the parasitic resistor comprises a lightly doped well region with the second conductivity type contacting the guard ring, and a heavily doped guard ring contact region with the second conductivity type in the well region, wherein the guard ring contact is formed on the guard ring contact region, and wherein the guard ring is separated from the guard ring contact region.

13. A semiconductor device, comprises:
   a cathode terminal, coupled to a semiconductor layer, wherein the semiconductor layer has a first conductivity type;
   an anode terminal, coupled to a Schottky diode metal contact, wherein the Schottky diode metal contact is formed on the semiconductor layer having a second conductivity type;
   a guard ring terminal, coupled to a guard ring, wherein the guard ring has a second conductivity type, and wherein the guard ring is at the periphery of the Schottky diode interface and wherein the guard ring is separated apart from the Schottky diode metal contact.

14. The semiconductor device according to claim 13, wherein an electrical resistance module is coupled between the anode terminal and the guard ring terminal.

15. The semiconductor device according to claim 13, wherein multiple resistors are coupled between the anode terminal and the guard ring terminal.

16. A method for forming a semiconductor device, comprising:
   forming a first semiconductor layer on a semiconductor substrate, wherein the first layer has a first conductivity type and the semiconductor substrate has a second conductivity type;
   forming a heavily doped cathode contact region in the first semiconductor layer, and wherein the cathode contact region has the first conductivity type;
   forming a guard ring in the first semiconductor layer and coupling the guard ring to a guard ring contact, wherein the guard ring comprises an interface to the first semiconductor layer, and wherein the guard ring has a second conductivity type;
   forming a Schottky diode metal contact coupled to the first semiconductor layer, wherein the Schottky diode metal contact comprises a Schottky diode interface to the first semiconductor layer wherein the guard ring is formed at the periphery of the Schottky diode interface, and wherein the Schottky diode metal contact separates apart from the guard ring; and
   forming an electrical resistance module between the Schottky diode metal contact and the guard ring.

17. The method for forming a semiconductor device according to claim 16, wherein forming an electrical resistance module comprises forming an integrated resistor.

18. The method for forming a semiconductor device according to claim 16, wherein forming an electrical resistance module comprises coupling a discrete resistor between the Schottky diode metal contact and the guard ring contact.

19. The method for forming a semiconductor device according to claim 16, wherein forming an electrical resistance module comprises forming a parasitic resistor.

20. The method for forming a semiconductor device according to claim 19, wherein forming the parasitic resistor comprises:
   forming a lightly doped well region partly enclosing the outermost part of the guard ring, wherein the well region has a second conductivity type; and
   forming a guard ring contact region in the well region, wherein the guard ring contact is formed on the guard ring contact region, wherein the well region separates the guard ring contact region from the guard ring, and wherein the guard ring contact region has a second conductivity type.

* * * * *